United States Patent [19]

Muto

[11] Patent Number: 4,909,744
[45] Date of Patent: Mar. 20, 1990

[54] BUSBAR CONNECTION STRUCTURE

[75] Inventor: Motomu Muto, Shizuoka, Japan

[73] Assignee: Yazaki Corporation, Japan

[21] Appl. No.: 245,334

[22] Filed: Sep. 16, 1988

[30] Foreign Application Priority Data

Sep. 17, 1987 [JP] Japan .................. 62-140920[U]

[51] Int. Cl.$^4$ .............................................. H01R 9/09
[52] U.S. Cl. ..................................... 439/65; 439/210; 439/251
[58] Field of Search ................ 439/65, 74, 84, 85, 439/210, 213, 251

[56] References Cited

U.S. PATENT DOCUMENTS

| 3,109,958 | 11/1963 | Delachapelle et al. | 439/85 |
| 3,980,367 | 9/1976 | Laserson et al. | 439/65 |
| 4,274,691 | 7/1981 | Abernethy et al. | 439/507 |
| 4,508,398 | 4/1985 | Stepan et al. | 439/65 |

Primary Examiner—P. Austin Bradley
Attorney, Agent, or Firm—Wigman & Cohen

[57] ABSTRACT

To minimize the number of vertically extending tab-shaped male terminals in busbar connection structure, that is, to maximize the busbar material yield or busbar arrangement density on an insulating plate, two busbars stacked with at least one insulating plate intervening between the two busbars are connected to each other by an elastic U-shaped connecting clip at end surfaces of the busbars or the insulating plate.

4 Claims, 3 Drawing Sheets

BUSBAR CONNECTION STRUCTURE

BACKGROUND OF THE INVENTION

1. Field of the Invention

The present invention relates to an improvement in busbar connection structure, and more specifically to busbars incorporated in a junction box used with electric appliances for an automotive vehicle. Here, busbars are metallic strip-shaped conductors connected between plural circuits so as to construct internal circuits. Through the busbars, a relatively large current is passed. That is, the busbars are used as common lines for connecting a negative (or positive) terminal of a dc power supply or each phase of an ac power supply to load circuits.

2. Description of the Prior Art

FIG. 1(A) shows an example of an internal circuit formed by three busbars 1A, 1B and 1C and two insulating plates 2A and 2B. As shown in FIG. 1(B), each busbar 1 is formed with a horizontally extending trunk portion 1e, plural horizontal branch portions 1f, 1g and 1h, plural upward extending tab-shaped male terminals 1a, and plural downward extending tab-shaped male terminals 1b.

With reference to FIG. 1(A) again, a first busbar 1A is arranged on a first insulating plate 2A by inserting a downward extending tab-shaped male terminal 1b into a hole 2a formed in the plate 2A. A second busbar 1B is sandwiched between the first insulating plate 2A and a second insulating plate 2B by inserting plural upward extending tab-shaped male terminals 1a into holes 2a formed in the first plate 2A and plural downward extending tab-shaped male terminals 1b into holes 2b formed in the second plate 2B. In the same way, a third busbar 1c is placed on the lower surface of the third insulating plate 2B by inserting plural upward extending tab-shaped male terminals 1a into holes 2b formed in the second plate 2B, respectively. The inserted tab-shaped male terminals of one busbar arranged on one surface of the insulating plate are connected to the inserted tab-shaped male terminals or the trunk or branch portions of the other busbar arranged on the opposite surface of the same insulating plate, respectively by soldering, for instance.

In the prior-art busbar connection structure, however, since two busbars arranged on both the opposite surfaces of a single insulating plate are connected by use of upward or downward extending tab-shaped male terminals, there exists a problem in that the busbar conductor arrangement density on an insulating plate is lowered and therefore the material yield (a ratio of useful material quantity to wasted material quantity) is lowered, thus increasing the material cost.

SUMMARY OF THE INVENTION

With these problems in mind, therefore, it is the primary object of the present invention to provide an improvement in busbar connection structure which can increase busbar arrangement density and therefore material yield.

To achieve the above-mentioned object, a busbar connecting structure according to the present invention comprises (a) at least one insulating plate; (b) at least two busbars arranged on at least one surface of the insulating plate; (c) and at least one elastic U-shaped connecting clip for connecting the two busbars at end surfaces of the busbars.

In the busbar connecting structure according to the present invention, the ordinary busbar is divided into an appropriate number of simple busbars, and the divided busbars are simply connected by use of connecting clips. Therefore, it is possible to improve the busbar conductor arrangement density on the insulating plate or the material yield of the busbars.

BRIEF DESCRIPTION OF THE DRAWINGS

The features and advantages of the improvement in busbar connection structure according to the present will be more clearly appreciated from the following description taken in conjunction with the accompanying drawings in which like reference numerals designate the same or similar elements or parts throughout the figures thereof and in which.

DETAILED DESCRIPTION OF THE PREFERRED EMBODIMENTS

Figure 1A:
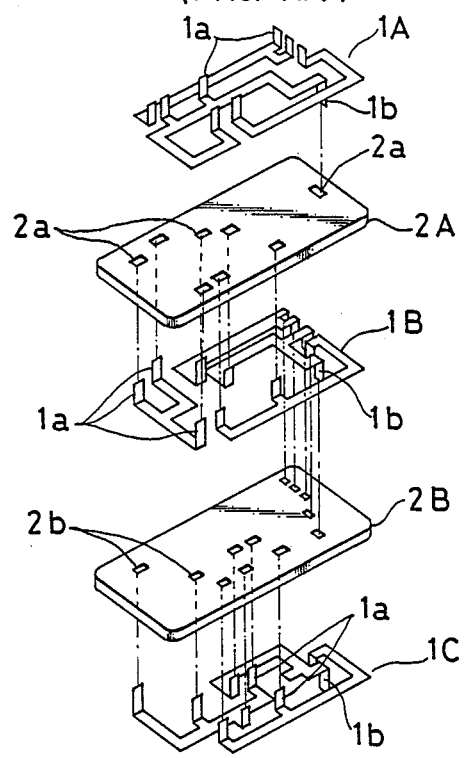
FIG. 1(A) is an exploded view of a prior-art busbar connection structure.
Figure 1B:
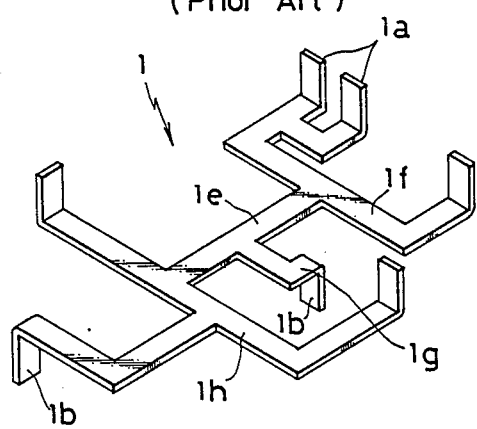
FIG. 1(B) is an enlarged view showing an example of ordinary prior-art busbar.
Figure 2A:
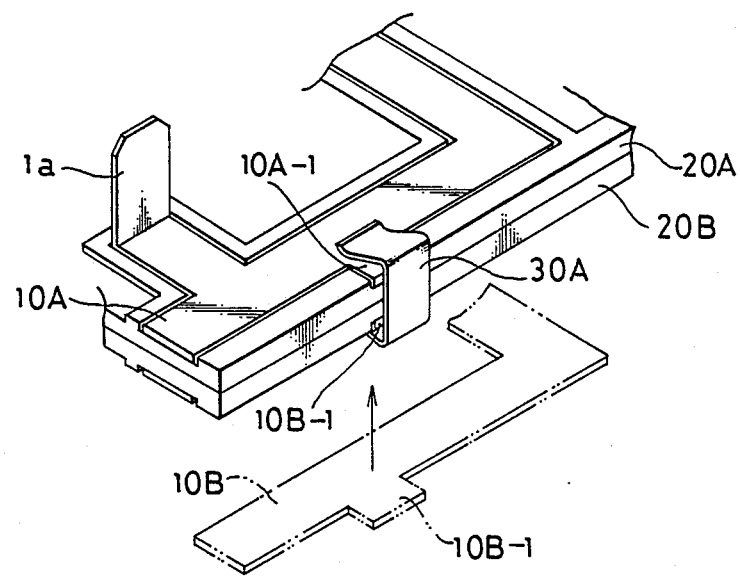
FIG. 2(A) is a perspective view showing a first example of the busbar connection structure according to the present invention.

FIG. 2(A) shows a first example of the busbar connection structure of the present invention. This connection structure is composed of two insulating plates 20A and 20B and three busbars 10A, 10B and 10C. The first busbar 10A is formed into a flat busbar having a single upward extending tab-shaped male terminal (e.g. a positive power supply terminal) and a connecting end 10A-1, being arranged on the upper surface of the first insulating plate 20A. The second busbar 10B is formed into a flat busbar having a connecting end 10B-1, being arranged on the lower surface of the second insulating plate 20B. The third busbar 10C is formed into a flat busbar having a connecting end (not shown), being sandwiched between the two insulating plates 20A and 20B.

Figure 2B:
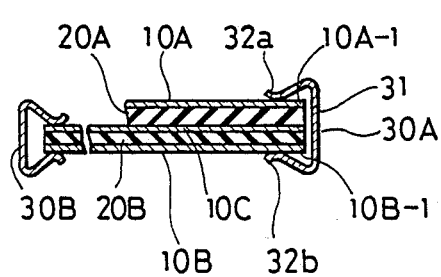
FIG. 2(B) is a cross-sectional view for assistance in explaining the methods of connecting busbars by use of elastic U-shaped connecting clips according to the present invention.

As depicted in FIG. 2(B), the first and second busbars 10A and 10B are connected to each other by a first elastic U-shaped connecting clip 30A attached to the two connecting ends 10A-1 and 10B-1 of the two busbars 10A and 10B at the edge portion of the busbars and insulating plates. Further, the second and third busbars 10B and 10C are connected to each other by a second elastic U-shaped connecting clip 30B attached to other connecting ends (not shown) of the two busbars 10B and 10C.

Figure 2C:
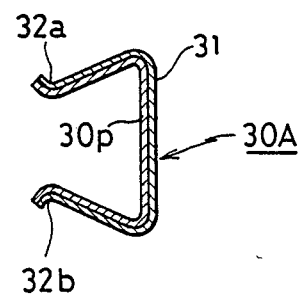
FIG. 2(C) is an enlarged cross-sectional view of the clip according to the present invention.

FIG. 2(C) is an enlarged cross-sectional view showing the elastic U-shaped connecting clip 30A of the present invention. The clip 30A is formed into a U-shaped member composed of a base portion 31 and two contact end portions 32a and 32b. Further, a conductive plating layer 30P is formed on the inside surface of the metallic U-shaped clip 30A for providing better connection of the two busbars.

In the busbar connection structure of the present invention, since a plurality of busbars stacked with an insulating plate intervening between the two busbars are connected by elastic U-shaped connecting clips attached to connecting ends (outer edge portions of the busbars), it is possible to minimize the number of vertically extending tab-shaped male terminals for connecting two different busbars. That is, in the case of FIG. 2(A), only a single bent male terminal is formed to supply a power supply voltage.

Figure 3A:
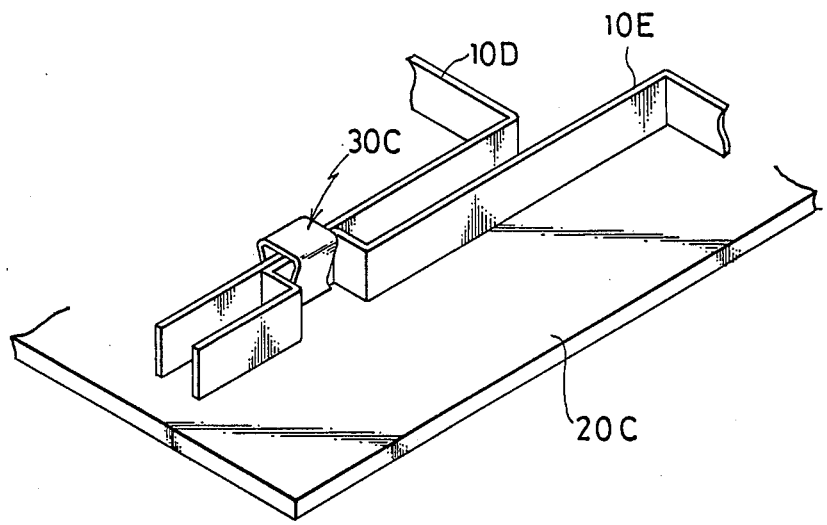
FIG. 3(A) is a perspective view showing a second example of the busbar connection structure according to the present invention.
Figure 3B:
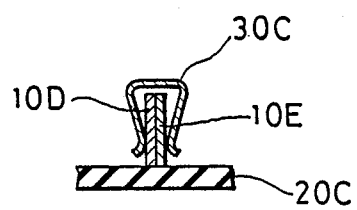
FIG. 3(B) is a cross-sectional view for assistance in explaining another method of connecting busbars by use of an elastic U-shaped connecting clip according to the present invention.

FIG. 3(A) shows a second example of the busbar connection structure of the present invention. This connection structure is composed of a single insulating plate 20C and two busbars 10D and 10E both arranged on the insulating plate 20C with each lateral direction of the strip directed perpendicular to the flat surface of the insulating plate 20C. In this example, the two busbars 10D and 10E can be connected by an elastic U-shaped connecting clip 30C as shown in FIGS. 3(A) and 3(B).

As described above, in the busbar connecting structure according to the present invention, since a plurality of busbars can directly be connected to each other by use of elastic U-shaped connecting clips irrespective of the presence of insulating plates, it is possible to minimize the number of vertically extending tab-shaped male terminals and therefore to improve the busbar conductor arrangement density or the material yield of the busbars.

What is claimed is:
1. A busbar connecting structure, comprising:
   at least one insulating plate having first and second surfaces and having edges therearound;
   two busbars arranged on the first and second surfaces, respectively, and each of said busbars having at least one connecting end which extends to the edge of said insulating plate, the connecting ends of said busbars being located on substantially opposite sides of said insulating plate when these busbars are assembled with said insulating plate; and
   at least one elastic U-shaped connecting clip for electrically connecting said two busbars at the position where the connecting ends are provided.
2. The busbar connecting structure of claim 1, wherein said elastic U-shaped connecting clip is formed with a conductive plating layer on an inner surface thereof.
3. A busbar connecting structure, comprising:
   (a) at least one insulating plate having at least one surface;
   (b) at least two busbars arranged on the at least one surface of said insulating plate; and
   (c) at least one elastic U-shaped connecting clip for connecting said two busbars at the surface of said insulating plate.
4. The busbar connecting structure of claim 3, wherein said elastic U-shaped connecting clip is formed with a conductive plating layer on an inner surface thereof.

* * * * *